United States Patent
Park et al.

(10) Patent No.: US 9,590,142 B2
(45) Date of Patent: Mar. 7, 2017

(54) LIGHT EMITTING DIODE HAVING MAGNETIC STRUCTURE AND METHOD OF FABRICATING THE SAME

(71) Applicant: GWANGJU INSTITUTE OF SCIENCE AND TECHNOLOGY, Gwangju (KR)

(72) Inventors: Seong-Ju Park, Gwangju (KR); Youngchul Leem, Gwangju (KR); Jae-Joon Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/507,410

(22) Filed: Oct. 6, 2014

(65) Prior Publication Data
US 2015/0097205 A1   Apr. 9, 2015

(30) Foreign Application Priority Data
Oct. 7, 2013   (KR) .......................... 10-2013-0118888

(51) Int. Cl.
*H01L 33/00*   (2010.01)
*H01L 33/40*   (2010.01)
*H01L 33/44*   (2010.01)

(52) U.S. Cl.
CPC ............ *H01L 33/405* (2013.01); *H01L 33/44* (2013.01)

(58) Field of Classification Search
CPC .............................. H01L 33/405; H01L 33/44
USPC .......................................................... 257/98
See application file for complete search history.

(56) References Cited

U.S. PATENT DOCUMENTS

| | | | | |
|---|---|---|---|---|
| 2006/0006463 A1* | 1/2006 | Islam | ..................... | B82Y 10/00 257/347 |
| 2007/0228491 A1* | 10/2007 | Forbes | ................ | H01L 29/0657 257/401 |
| 2009/0267049 A1* | 10/2009 | Cho | ........................ | H01L 33/18 257/13 |
| 2010/0316327 A1* | 12/2010 | Montoya | ................ | B82Y 20/00 385/6 |
| 2013/0062638 A1* | 3/2013 | Onushkin | ............. | H01L 33/382 257/98 |
| 2015/0109587 A1* | 4/2015 | Natsumeda et al. | ............ | 353/84 |

* cited by examiner

*Primary Examiner* — Jerome Jackson, Jr.
(74) *Attorney, Agent, or Firm* — Hauptman Ham, LLP

(57) ABSTRACT

A light emitting diode including a magnetic structure and a method of fabricating the same are disclosed. The magnetic structure composed of passivation layers and a magnetic layer is disposed inside a luminous structure composed of an active layer and a semiconductor layer. In the light emitting diode, the magnetic structure including the magnetic layer is disposed on a side surface of the active layer to improve recombination rate of charge carriers for light emission by increasing influence of a magnetic field applied to the active layer. In addition, the light emitting diode according to the present invention allows change in position of the magnetic structure including the magnetic layer depending upon an etched shape of the luminous structure, thereby realizing various magnetic field distributions.

13 Claims, 5 Drawing Sheets

LIGHT EMITTING DIODE HAVING MAGNETIC STRUCTURE AND METHOD OF FABRICATING THE SAME

CROSS-REFERENCE TO RELATED APPLICATION

This application claims priority to Korean Patent Application No. 10-2013-0118888 filed on 7 Oct. 2013, and all the benefits accruing therefrom under 35 U.S.C. §119, the contents of which is incorporated by reference in its entirety.

BACKGROUND

1. Technical Field

The present invention relates to a light emitting diode having a magnetic structure, and more particularly, to a light emitting diode that includes a magnetic structure composed of passivation layers and a magnetic layer inside a luminous structure composed of an active layer and a semiconductor layer to improve luminous efficiency, and a method of fabricating the same.

2. Description of the Related Art

Light emitting diodes are semiconductor devices that generate light through recombination of holes and electrons. With various advantages such as low power consumption, vibration resistance, rapid response, high luminous efficiency similar to fluorescent lamps, and the like, light emitting diodes are broadly used as various forms of light sources for displays, electronic devices, lighting devices, and the like. Various studies have been made to enhance efficiency of such light emitting diodes so as to keep up with the trend of increasing expansion of application ranges of the light emitting diodes.

In the related art, an additional magnetic layer is inserted into a light emitting diode in order to improve efficiency of the light emitting diodes through change of behavior of charge carriers within the light emitting diode.

FIG. 1 is a sectional view of a typical light emitting diode having a magnetic layer. Referring to FIG. 1, the light emitting diode includes a buffer layer 20, a first conductive type semiconductor layer 30, an active layer 40, a second conductive type semiconductor layer 50, a reflective electrode layer 60, and a magnetic layer 80 sequentially stacked on a substrate 10 in an upward direction, in which a second electrode 70 is formed on an exposed region of the first conductive type semiconductor layer 30. The magnetic layer 80 generates a magnetic field and can improve recombination rate of electrons and holes for light emission by affecting the electrons and the holes carrying charges in the light emitting diode.

However, such a typical light emitting diode can has a structural constraint in generation of a magnetic field which can affect behavior of charge carriers. FIG. 2 is a graph depicting magnitudes and directions of a magnetic field applied to an active layer depending upon distance to the magnetic layer in the typical light emitting diode. Referring to FIG. 2, it can be seen that the magnitude of the magnetic field applied to the active layer within the light emitting diode is highest at side surfaces of the active layer. As such, although the typical light emitting diode has the magnetic layer formed over an upper surface of the electrode layer, the magnetic field generated by the magnetic layer can provide great influence only on the side surfaces of the semiconductor layer, thereby providing limitation in improvement of luminous efficiency.

BRIEF SUMMARY

It is one aspect of the present invention to provide a light emitting diode that has a magnetic structure including a magnetic layer formed on a side surface of an active layer to improve recombination rate of charge carriers for light emission by increasing influence of a magnetic field on the charge carriers in the active layer.

In accordance with one aspect of the present invention, a light emitting diode includes: a substrate; a luminous structure formed by sequentially depositing a first conductive type semiconductor layer, an active layer, and a second conductive type semiconductor layer on the substrate; a reflective electrode layer formed on an upper side of the second conductive type semiconductor layer remaining after selectively etching part of the luminous structure to expose an inner region of the luminous structure; a second electrode formed on a partially exposed surface of the first conductive type semiconductor layer; and a magnetic structure formed in the exposed inner region of the luminous structure, wherein the magnetic structure includes passivation layers formed on side surfaces of the etched region of the luminous structure and a magnetic layer formed between the passivation layers.

The magnetic layer of the magnetic structure may be separated from a side surface of the active layer of the luminous structure. to The magnetic structure may be formed in singular or in plural in the etched region depending upon an etched shape of the luminous structure.

In accordance with another aspect of the present invention, a method of fabricating a light emitting diode includes: sequentially stacking a first conductive type semiconductor layer, an active layer, and a second conductive type semiconductor layer on a substrate to form a luminous structure; selectively etching part of the luminous structure to expose an inner region of the luminous structure; forming a reflective electrode layer on an upper side of the second conductive type semiconductor layer of the remaining luminous structure subjected to etching; forming a second electrode on a partially exposed region of the first conductive type semiconductor layer; and forming a magnetic structure in the inner region of the luminous structure exposed by etching the luminous structure, wherein forming the magnetic structure includes forming passivation layers on side surfaces of the etched region of the luminous structure and forming a magnetic layer between the passivation layers.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Light Emitting Diode Including Magnetic Structure

Embodiments of the present invention will now be described in detail with reference to the accompanying drawings.

It should be understood that the following embodiments are given by way of illustration only and the present invention is not limited to the following embodiments. Rather, it should be understood that various modifications, variations and alterations can be made without departing from the spirit and scope of the present invention defined by the claims and equivalents thereof.

Figure 3:
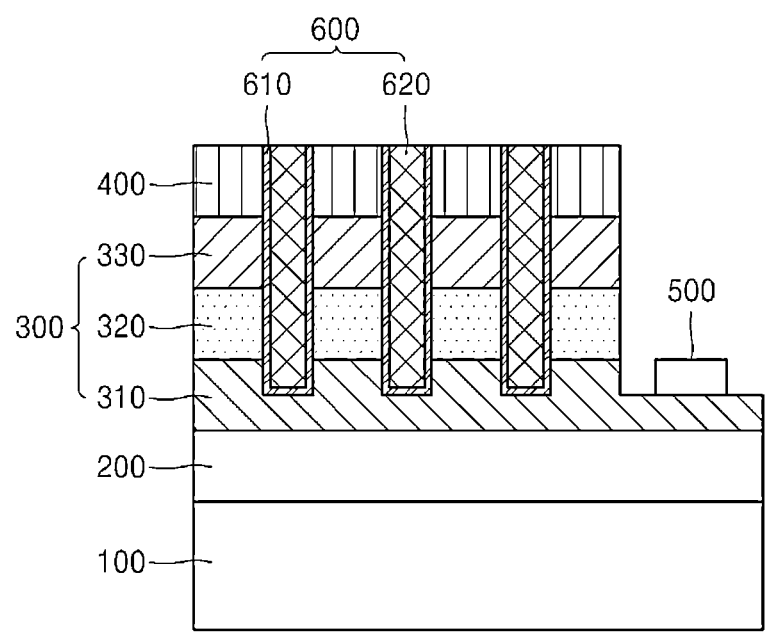
FIG. 3 is a sectional view of a light emitting diode including a magnetic structure according to one embodiment of the present invention.

FIG. 3 is a sectional view of a light emitting diode including a magnetic structure according to one embodiment of the present invention.

Referring to FIG. 3, a light emitting diode including a magnetic structure according to one embodiment of the invention includes a substrate 100; a luminous structure 300 formed by sequentially depositing a first conductive type semiconductor layer 310, an active layer 320 and a second conductive type semiconductor layer 330 on the substrate 100; a buffer layer 200 formed between the substrate 100 and the first conductive type semiconductor layer 300; a reflective electrode layer 400 formed on an upper side of the second conductive type semiconductor layer 330, which remains after selectively etching part of the luminous structure to expose an inner region of the luminous structure 300; a second electrode 500 formed on a partially exposed surface of the first conductive type semiconductor layer 310; and a magnetic structure 600 formed in the exposed inner region of the luminous structure 300, wherein the magnetic structure 600 includes passivation layers 610 formed on side surfaces of the etched region of the luminous structure 300 and a magnetic layer formed between the passivation layers 610.

The substrate 100 acts as a matrix that determines growth of semiconductor layers and may be formed of a material corresponding to properties of a semiconductor to be grown thereon, such as lattice constant and the like. The substrate 100 may be any one selected from among a sapphire ($Al_2O_3$) substrate, a ZnO substrate, a Si substrate, a GaAs substrate, a SiC substrate, an InP substrate, and a GaN substrate, without being limited thereto. When gallium nitride-based semiconductor layers are formed on the substrate, the substrate may be formed a sapphire ($Al_2O_3$) substrate that has a similar lattice constant thereto.

The buffer layer 200 may be placed on the substrate 100. The buffer layer 200 may be formed on the overall upper surface of the substrate 100 to relieve lattice mismatch between the substrate 100 and the semiconductor layers to be formed thereon. The buffer layer 200 may be formed of one un-doped material selected from among SiC, ZnO, Si, GaAs, AlN and GaN. When the substrate 100 is an insulating substrate such as a sapphire substrate, the buffer layer 200 may be formed of a conductive material.

Each of the first conductive type semiconductor layer 310 and the second conductive type semiconductor layer 330 may be composed of a single layer or multiple layers depending upon the kind of light emitting diode to be fabricated, and may contain at least one selected from the group consisting of silicon (Si), magnesium (Mg), zinc (Zn), and combinations thereof. For example, the first conductive type semiconductor layer 310 may be an n-type semiconductor layer doped with n-type impurities and may include at least one selected from among an MN layer, a GaN layer and an $Al_xGa_{(1-x)}N$ ($0 \leq x \leq 1$) layer. For example, the second conductive type semiconductor layer 330 may be a p-type semiconductor layer doped with p-type impurities and may include at least one selected from among a SiC layer, a ZnO layer, a Si layer, a GaAs layer, an AlN layer, a GaN layer and an $Al_xGa_{(1-x)}N$ ($0 \leq x \leq 1$) layer.

The active layer 320 is disposed between the first conductive type semiconductor layer 310 and the second conductive type semiconductor layer 330 to emit energy in the form of light generated by recombination of electrons and holes. The active layer 320 may have a single quantum well structure or a multi-quantum well structure in which an InGaN well layer represented by $In_xAl_yGa_{(1-x-y)}N$ ($0 \leq x < 1$, $0 \leq y < 1$, and $0 \leq x+y < 1$) and a GaN bather layer are alternately stacked one above another.

The reflective electrode layer 400 may be composed of a reflective layer and a first electrode. The reflective layer reflects light generated in the active layer 320 and may be formed of a metallic material having high reflectance. For example, the reflective layer may be formed of silver (Ag), aluminum (Al), or alloys thereof.

The first electrode of the reflective electrode layer 400 and the second electrode 500 act as means for supplying drive power causing the active layer 320 to generate light, and may be formed of at least one metallic material selected from the group consisting of palladium (Pd), rhodium (Rh), platinum (Pt), tantalum (Ta), nickel (Ni), chromium (Cr), gold (Au), titanium (Ti), and alloys thereof in order to obtain a conductive material having low contact resistance and high reflectivity. The second electrode 500 may be placed on an exposed region of the first conductive type semiconductor layer 310 that is placed on the substrate 100 and doped with n-type impurities.

The passivation layers 610 may be formed of at least one material selected from among $SiO_2$, SiN, $HfO_2$, $Al_2O_3$, metal oxides, metal nitrides, metal fluorides, and metal sulfides. The passivation layers 610 are provided for insulation and electrically insulate the luminous structure 300 to prevent deterioration in luminous efficiency due to a flow of electric current in the etched inner region of the luminous structure 300 when current flows in the luminous structure 300. In addition, the passivation layers 610 can mechanically protect the magnetic layer 620 formed between the passivation layer 610.

The magnetic layer 620 may be formed of at least one material selected from the group consisting of cobalt (Co), iron (Fe), nickel (Ni), gadolinium (Gd), dysprosium (Dy), alloys thereof, and other ferromagnetic materials.

The magnetic structure 600 may include a structure wherein the magnetic layer 620 is separated from a side surface of the active layer 320 of the luminous structure 300.

Figure 4:
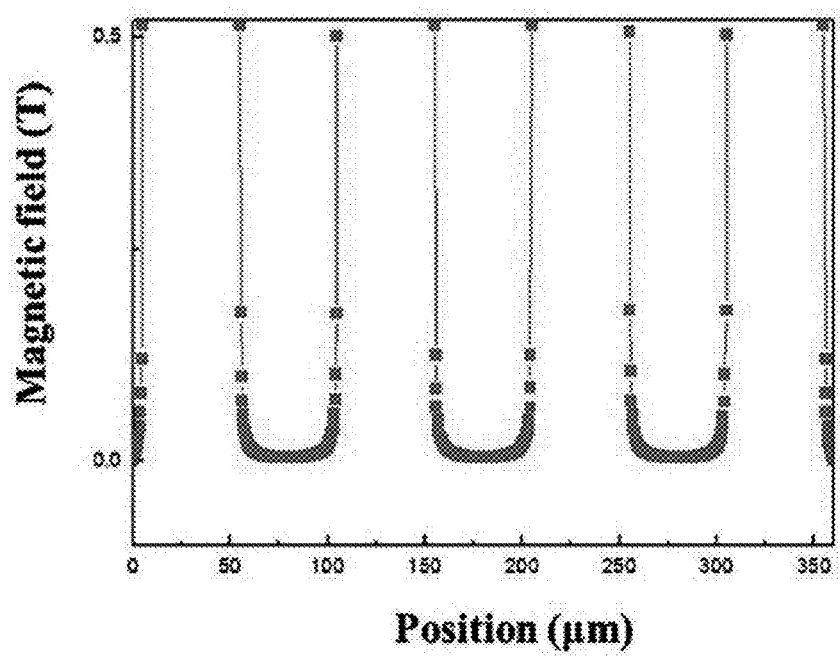
FIG. 4 is a graph depicting magnitudes and directions of a magnetic field applied to an active layer depending upon distance to the magnetic layer in the light emitting diode according to the embodiment.

FIG. 4 is a graph depicting magnitudes and directions of a magnetic field applied to an active layer depending upon distance to the magnetic layer in the light emitting diode according to the embodiment of the invention.

Figure 1:
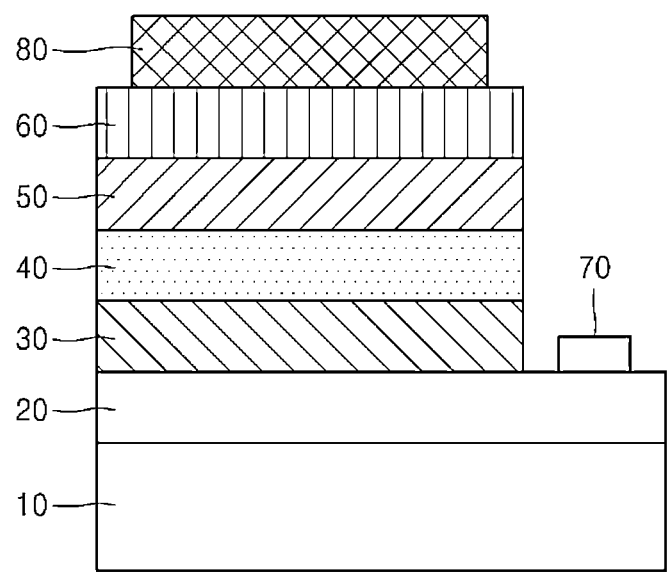
FIG. 1 is a sectional view of a typical light emitting diode including a magnetic layer.
Figure 2:
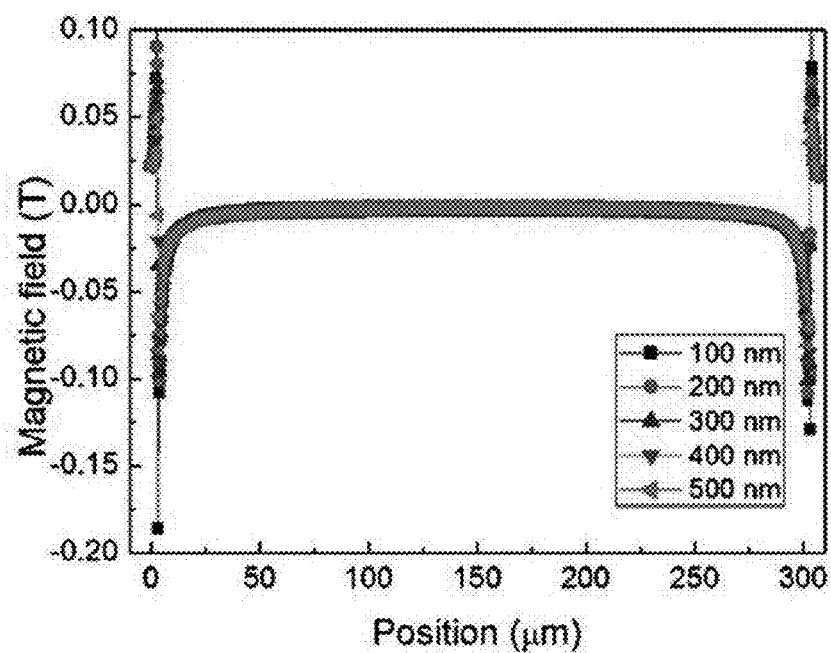
FIG. 2 is a graph depicting magnitudes and directions of a magnetic field applied to an active layer depending upon distance to the magnetic layer in the typical light emitting diode.

In FIG. 4, it can be confirmed that the distribution and magnitude of a magnetic field generated by the magnetic structure disposed at the side surface of the active layer are improved as compared with those of the magnetic field generated by the magnetic structure shown in FIG. 2.

When electric current is applied to the light emitting diode, electrons and holes migrate due to the electric field. When the light emitting diode includes the magnetic structure including the magnetic layer, a non-uniform magnetic field is generated in the light emitting diode by the magnetic layer of the magnetic structure and affects electrons and holes, whereby the electrons and the holes migrate inside the active layer in a direction parallel to the substrate, that is, in an in-plane direction, by Lorenz force. As the electrons and the holes migrate inside the active layer, the recombination rate of electrons and holes for light emission is increased, thereby improving luminous efficiency of the light emitting diode. Here, in the light emitting diode according to this embodiment, since the magnitude of the non-uniform magnetic field can be optimized at the side surface of the active layer, the magnetic structure including the magnetic layer may be placed on the side surface of the active layer to increase influence of the magnetic field, thereby further improving the recombination rate of holes and electrons for light emission.

In addition, referring to FIG. 3, the light emitting diode may include a single magnetic structure 600 or a plurality of magnetic structures 600 in the etched region of the luminous structure 300 according to the etched shape thereof. This structure allows arrangement of the magnetic structures 600 including the magnetic layer 620 in various ways, thereby realizing distribution of magnetic fields generated by the magnetic layer 620 in further various ways. As a result, the recombination rate of charge carriers influenced by the magnitude and distribution of the magnetic field can be further enhanced.

Method of Fabricating Light Emitting Diode Including Magnetic Structure

Figure 5:
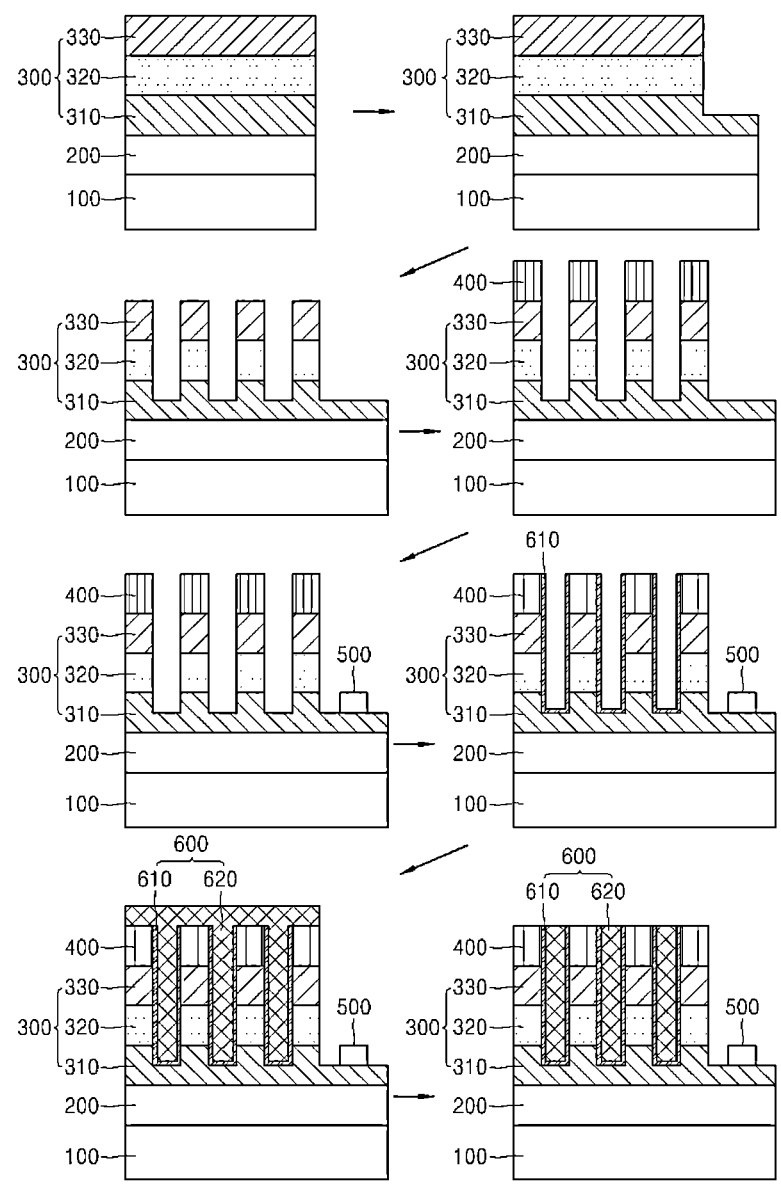
FIG. 5 is a view illustrating a method of fabricating the light emitting diode including the magnetic structure shown in FIG. 3.

FIG. 5 is a view illustrating a method of fabricating the light emitting diode including the magnetic structure shown in FIG. 3.

Referring to FIG. 5, a method of fabricating a light emitting diode including a magnetic structure according to one embodiment of the invention includes sequentially stacking a first conductive type semiconductor layer 310, an active layer 320, and a second conductive type semiconductor layer 330 on a substrate 100 to form a luminous structure 300; selectively etching part of the luminous structure 300 to expose an inner region of the luminous structure 300; forming a reflective electrode layer 400 on an upper side of the remaining second conductive type semiconductor layer 330 of the luminous structure 300 subjected to etching; forming a second electrode 500 on a partially exposed region of the first conductive type semiconductor layer 310; and forming a magnetic structure 600 in the inner region of the luminous structure 300 exposed by etching the luminous structure 300, wherein forming the magnetic structure 600 includes forming passivation layers 610 on side surfaces of the etched region of the luminous structure 300 and forming a magnetic layer 620 between the passivation layers 610.

The operation of forming the magnetic structure 600 includes forming the magnetic structure such that the magnetic layer 620 of the magnetic structure 600 is separated from a side surface of the active layer 320 of the luminous structure 300. With this structure, the magnitude of a magnetic field applied to the active layer 320 can be optimized, thereby improving luminous efficiency of the light emitting diode.

The substrate 100 may be any one selected from among a sapphire ($Al_2O_3$) substrate, a ZnO substrate, a Si substrate, a GaAs substrate, a SiC substrate, an InP substrate, and a GaN substrate, without being limited thereto. A buffer layer 200 may be further disposed between the substrate 100 and the luminous structure 300. The buffer layer 200 may be formed of one material selected from among SiC, ZnO, Si, GaAs, AlN and GaN by metal-organic chemical vapor deposition (MOCVD), molecular beam epitaxy (MBE), hydride vapor phase epitaxy (HVPE), and the like.

In the operation of sequentially forming the first conductive type semiconductor layer 310, the active layer 320 and the second conductive type semiconductor layer 330 on the substrate 100 to form the luminous structure 300, the luminous structure 300 is grown on the substrate 100 and the buffer layer 200 in a vertical direction by metal-organic chemical vapor deposition (MOCVD), molecular beam epitaxy (MBE), hydride vapor phase epitaxy (HYPE), or sputtering. Each of the first conductive type semiconductor layer 310 and the second conductive type semiconductor layer 330 may contain at least one dopant element selected from the group consisting of silicon (Si), magnesium (Mg), zinc (Zn), and combinations thereof to have conductive properties. The first conductive type semiconductor layer 310 may be formed as an n-type semiconductor layer doped with, for example, silicon (Si), and the second conductive type semiconductor layer 330 may be formed as a p-type semiconductor layer doped with, for example, zinc (Zn) or magnesium (Mg).

After forming the luminous structure 300, the method may further include mesa etching the luminous structure 300 such that the surface of the first conductive type semiconductor layer 310 can be partially exposed. This operation may be achieved by reactive ion etching (RIE), inductively coupled plasma (ICP), and the like. As such, the surface of the first conductive type semiconductor layer 310 is partially exposed by mesa etching, whereby the second electrode 500 can be formed on the exposed surface of the first conductive type semiconductor layer 310 in a subsequent process.

In the operation of selectively etching part of the luminous structure such that the inner region of the luminous structure can be exposed in order to allow the magnetic layer 620 to generate a magnetic field inside the luminous structure 300, etching may be performed in a perpendicular direction with respect to the substrate 100 by means of reactive ion etching (RIE) or inductively coupled plasma (ICP) etching based on physical or chemical dry etching. According to embodiments, etching may be performed in a variety of etching ranges, and the magnetic structure 600 may be formed in singular or plural in the etched region of the luminous structure depending upon an etched shape of the luminous structure 300. As a result, it is possible to realize various magnetic field distributions.

In the operation of forming the reflective electrode layer 400 on the upper side of the second conductive type semiconductor layer 330 of the remaining luminous structure 300 subjected to etching, the reflective electrode layer may include a reflective layer and a first electrode. The reflective layer of the reflective electrode layer 400 may be formed of a metallic material having high reflectance by sputtering or vacuum evaporation, without being limited thereto. The first electrode of the reflective electrode layer 400 may be formed of at least one metallic material selected from the group consisting of palladium (Pd), rhodium (Rh), platinum (Pt), tantalum (Ta), nickel (Ni), chromium (Cr), gold (Au), titanium (Ti), and alloys thereof.

In the operation of forming the second electrode on the partially exposed region of the first conductive type semiconductor layer 310, the second electrode 500 may be formed of at least one metallic material selected from the group consisting of palladium (Pd), rhodium (Rh), platinum (Pt), tantalum (Ta), nickel (Ni), chromium (Cr), gold (Au), titanium (Ti), and alloys thereof.

In the operation of forming the magnetic structure 600 in the inner region of the luminous structure 300 exposed by etching the luminous structure 300, passivation layers 610 are formed on side surfaces in the etched region of the luminous structure 300, followed by forming a magnetic layer 620 between the passivation layers 610. The passivation layers 610 may be formed of at least one material selected from among $SiO_2$, SiN, $HfO_2$, $Al_2O_3$, metal oxides, metal nitrides, metal fluorides, and metal sulfides; and the magnetic layer 620 may be formed of at least one ferromagnetic material selected from the group consisting of cobalt (Co), iron (Fe), nickel (Ni), gadolinium (Gd), dysprosium (Dy) and alloys thereof. The magnetic layer 620 may be formed by a thermal evaporation system, an e-beam evaporation system, a sputtering system, or a laser evaporation system. Then, the light emitting diode fabricated by the method according to the embodiment is subjected to annealing in an annealing furnace provided with a permanent magnet such that the magnetic layer 620 formed in the light emitting diode can be magnetized in a horizontal direction with respect to the substrate.

After forming the magnetic structure 600, the method may further include removing the magnetic structure 600 from the reflective electrode layer 400 by etching. The material forming the magnetic layer 620 can also be deposited on the reflective electrode layer 400 in the course of forming the magnetic structure 600. The magnetic structure 600 may be removed by general dry etching or wet etching.

As described above, according to the present invention, the magnetic structure including the magnetic layer is disposed on the side surface of the luminous structure composed of the active layer and the semiconductor layers to recombination rate of charge carriers for light emission by increasing influence of a magnetic field applied to the active layer, thereby improving luminous efficiency of the light emitting diode.

In addition, the light emitting diode according to the present invention allows change in position of the magnetic structure including the magnetic layer depending upon an etched shape of the luminous structure, thereby realizing various magnetic field distributions.

Although some embodiments have been described herein, it should be understood by those skilled in the art that these embodiments are given by way of illustration only and the present invention is not limited thereto. It should be understood by those skilled in the art that various modifications, variations and alterations can be made without departing from the spirit and scope of the present invention. The scope of the present invention should be defined by the appended claims and equivalents thereof.

What is claimed is:

1. A light emitting diode, comprising:
    a substrate;
    a luminous structure including
        a first conductive type semiconductor layer on the substrate,
        an active layer on an upper surface of the first conductive type semiconductor layer,
        a second conductive type semiconductor layer on an upper surface of the active layer,
        an inner region penetrating the second conductive type semiconductor layer and the active layer, and
        an outer region penetrating the second conductive type semiconductor layer and the active layer,
        wherein the first conductive type semiconductor layer, the active layer, and the second conductive type semiconductor layer are stacked in sequence on the substrate;
    a first, reflective electrode on the second conductive type semiconductor layer and comprising an opening over the inner region of the luminous structure;
    a second electrode on the first conductive type semiconductor layer in the outer region; and
    a magnetic structure in the inner region and including
        a passivation layer on a wall of the inner region of the luminous structure, and
        a magnetic layer on the passivation layer and filling the inner region,
    wherein
        a first portion of the upper surface of the first conductive type semiconductor layer is exposed to the passivation layer in the inner region so that the passivation layer directly contacts the first portion of the upper surface of the first conductive type semiconductor layer in the inner region, and
        a second portion of the upper surface of the first conductive type semiconductor layer is exposed to the second electrode in the outer region so that the second electrode directly contacts the second portion of the upper surface of the first conductive type semiconductor layer in the outer region.

2. The light emitting diode according to claim 1, wherein the magnetic layer is separated from a side surface of the active layer in the inner region.

3. The light emitting diode according to claim 1, wherein the magnetic structure is formed in plural in the inner region.

4. The light emitting diode according to claim 1, wherein the passivation layer comprises at least one material selected from among $SiO_2$, SiN, $HfO_2$, and $Al_2O_3$.

5. The light emitting diode according to claim 1, wherein the magnetic layer comprises at least one material selected from among Co, Fe, Ni, Gd, Dy, and alloys thereof.

6. A method of fabricating a light emitting diode, the method comprising:
    sequentially stacking a first conductive type semiconductor layer, an active layer, and a second conductive type semiconductor layer on a substrate, to form a luminous structure;
    selectively etching the luminous structure through the second conductive type semiconductor layer and the active layer to form
        an inner region of the luminous structure, and
        an outer region of the luminous structure;
    forming a first, reflective electrode on an upper surface of the second conductive type semiconductor layer;
    forming a second electrode on the outer region of the luminous structure; and
    forming a magnetic structure in the inner region of the luminous structure by
        forming a passivation layer on a wall of the inner region, and
        forming a magnetic layer on the passivation layer to fill the inner region,
    wherein
        a first portion of an upper surface of the first conductive type semiconductor layer is exposed to the passivation layer in the inner region so that the passivation layer directly contacts the first portion of the upper surface of the first conductive type semiconductor layer in the inner region, and
        a second portion of the upper surface of the first conductive type semiconductor layer is exposed to the second electrode so that the second electrode directly contacts the second portion of the upper surface of the first conductive type semiconductor layer in the outer region.

7. The method according to claim 6, wherein the forming the magnetic structure comprises:
forming the magnetic layer separated from a side surface of the active layer in the inner region.

8. The method according to claim 6, further comprising, after forming the luminous structure, mesa etching the luminous structure such that the first conductive type semiconductor layer is partially etched and the first portion and second portion of the upper surface of the first conductive type semiconductor layer are obtained.

9. The method according to claim 6, wherein the magnetic structure is formed in plural in the inner region of the luminous structure.

10. The method according to claim 6, wherein the selectively etching the luminous structure is performed by reactive ion etching (RIE) or inductively coupled plasma (ICP) etching based on physical or chemical dry etching.

11. The method according to claim 6, wherein the forming the magnetic structure is performed using a thermal evaporation system, an e-beam evaporation system, a sputtering system, or a laser evaporation system.

12. The light emitting diode according to claim 1, wherein
the wall of the inner region extends through the second conductive type semiconductor layer and the active layer in a thickness direction of the substrate,
the inner region further has a bottom in the first conductive type semiconductor layer, the bottom connected to the wall and transverse to the wall,
the passivation layer is on both the wall and the bottom of the inner region,
the passivation layer on the bottom of the inner region is in direct physical contact with the first portion of the upper surface of the first conductive type semiconductor layer, and
the passivation layer on the bottom of the inner region is arranged, in the thickness direction of the substrate, between the magnetic layer and the first portion of the upper surface of the first conductive type semiconductor layer.

13. The light emitting diode according to claim 12, wherein the magnetic layer is free of direct physical contact with the first conductive type semiconductor layer, the second conductive type semiconductor layer and the active layer.

\* \* \* \* \*